(12) United States Patent
Sun et al.

(10) Patent No.: US 11,392,163 B1
(45) Date of Patent: Jul. 19, 2022

(54) ON-CHIP SUPPLY RIPPLE TOLERANT CLOCK DISTRIBUTION

(71) Applicant: Apple Inc., Cupertino, CA (US)

(72) Inventors: Bo Sun, Carlsbad, CA (US); Brian S. Leibowitz, San Francisco, CA (US); Jafar Savoj, Menlo Park, CA (US); Sanjeev K. Maheshwari, Fremont, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/482,877

(22) Filed: Sep. 23, 2021

(51) Int. Cl.
 *G06F 1/08* (2006.01)
 *H03L 7/081* (2006.01)

(52) U.S. Cl.
 CPC .............. *G06F 1/08* (2013.01); *H03L 7/0818* (2013.01)

(58) Field of Classification Search
 CPC ................................. G06F 1/08; H03L 7/0818
 See application file for complete search history.

(56) References Cited

U.S. PATENT DOCUMENTS

| | | | |
|---|---|---|---|
| 6,166,971 A | 12/2000 | Tamura et al. | |
| 9,209,821 B2 | 12/2015 | Bichan et al. | |
| 9,608,611 B1 * | 3/2017 | Hearne | H03K 5/135 |
| 10,014,868 B1 * | 7/2018 | Raj | H03L 7/24 |
| 10,686,582 B1 * | 6/2020 | Pasdast | H03L 1/00 |
| 11,115,176 B1 * | 9/2021 | Goudarzi | G06F 13/4291 |
| 2011/0280307 A1 * | 11/2011 | MacInnis | H04N 19/42 375/240.15 |
| 2015/0256326 A1 * | 9/2015 | Simpson | H04L 1/0045 375/355 |
| 2016/0373119 A1 * | 12/2016 | Wei | G11C 7/1093 |
| 2019/0165774 A1 * | 5/2019 | Kang | H03K 5/1565 |
| 2021/0367588 A1 * | 11/2021 | Lim | H03K 5/14 |

FOREIGN PATENT DOCUMENTS

| | | |
|---|---|---|
| DE | 102006051292 B4 | 8/2010 |
| JP | 2014523189 A5 * | 2/2017 |
| KR | 20090007038 A * | 10/2007 |

* cited by examiner

*Primary Examiner* — Adam D Houston
(74) *Attorney, Agent, or Firm* — Fenwick & West LLP

(57) ABSTRACT

Embodiments relate to a circuit implementation for controlling a delay of a clock signal. The clock delay control circuit includes a sensing circuit and a phase interpolator controlled by the sensing circuit. The sensing circuit generates a first control signal that increases when a level of a supply voltage increases, and decreases when the level of the supply voltage decreases. Moreover, the sensing circuit generates a second control signal that decreases when the level of the supply voltage increases, and increases when the level of the supply voltage decreases. The phase interpolator includes multiple paths, each having a different propagation delay. The coupling between each path and the output node of the phase interpolator is controlled by the control signals generated by the sensing circuit.

20 Claims, 11 Drawing Sheets

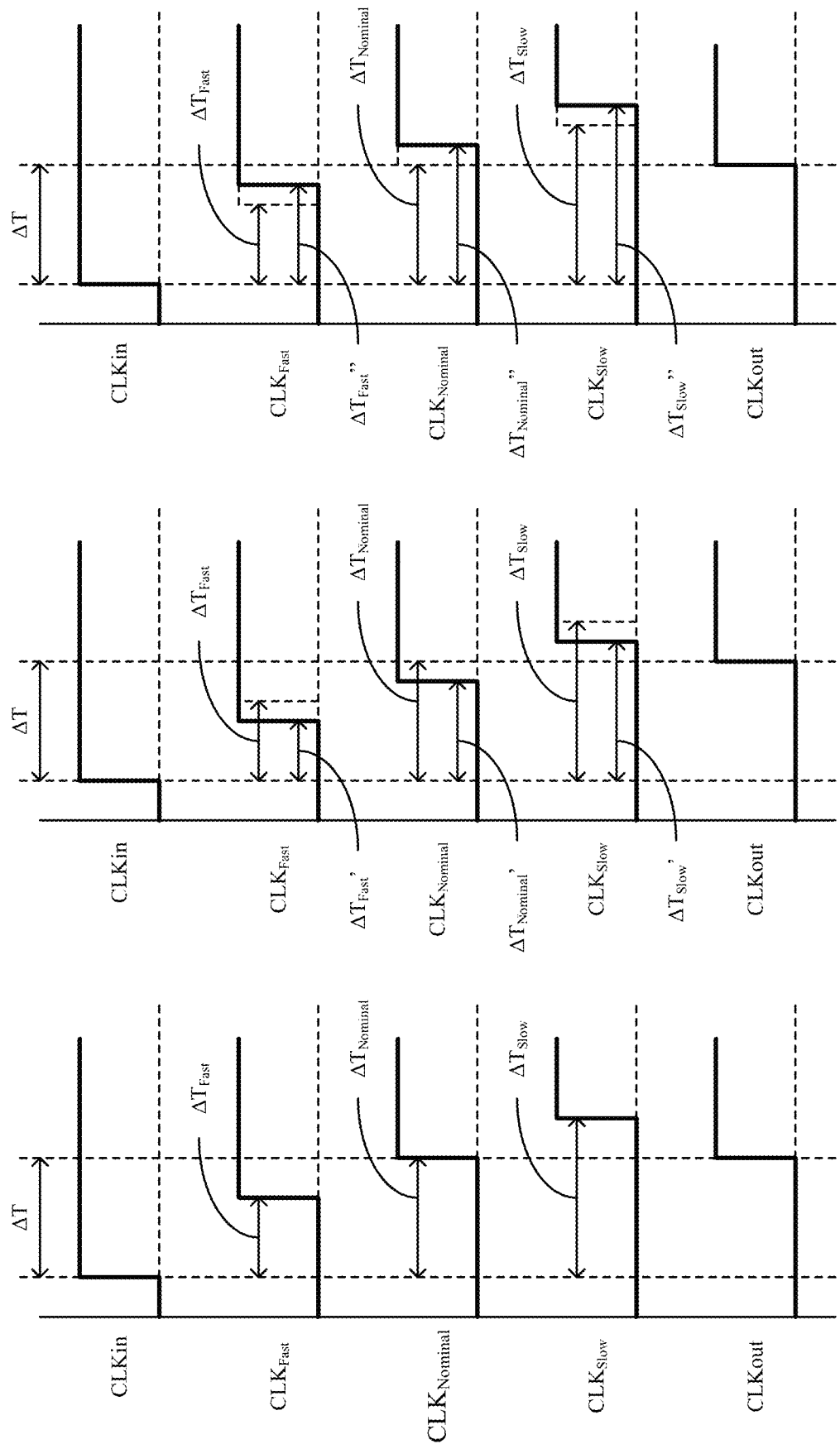

ON-CHIP SUPPLY RIPPLE TOLERANT CLOCK DISTRIBUTION

BACKGROUND

1. Field of the Disclosure

The present disclosure relates to integrated circuits, and more specifically to compensating a mismatch in clock distribution delay due to fluctuations in supply voltage.

2. Description Of The Related Art

As integrated circuits become more complex and larger in size, the distribution of clock signals throughout a single integrated circuit chip becomes more challenging. In particular, since the clock signal controls the timing of various components within the integrated circuit, mismatches in the arrival time of the clock signal in various portions of the integrated circuit can cause the integrated circuit to behave incorrectly, or may limit the speed or frequency at which the integrated circuit can be operated. Integrated circuits may include a clock distribution network that includes a set of buffers or amplifiers for buffering which may introduce a delay to the clock signal. Moreover, the delay introduced by the buffers or amplifiers is sensitive to changes in the voltage level of the power supply voltages powering the buffers or amplifiers. As such, if one sector of the integrated circuit suffers from a drop in supply voltage, that sector of the integrated circuit may experience an additional delay introduced to the clock signal delivered to that sector of the integrated circuit, potentially causing timing problems. As such, it would be advantageous to reduce the supply voltage level dependency on the propagation delay of the clock distribution network.

SUMMARY

Embodiments relate to a circuit implementation for controlling a delay of a clock signal. The clock delay control circuit includes a sensing circuit and a phase interpolator controlled by the sensing circuit. The sensing circuit may generate a first control signal that increases when a level of a supply voltage increases, and decreases when the level of the supply voltage decreases. Moreover, the sensing circuit may generate a second control signal that decreases when the level of the supply voltage increases, and increases when the level of the supply voltage decreases. The phase interpolator includes an input node for receiving an input clock signal, and an output node for providing a buffered clock signal. The phase interpolator has multiple paths, each having a different propagation delay. Each path receives the clock signal and delays the clock signal by their specific propagation delay. Furthermore, a coupling between each path and the output node of the phase interpolator is controlled by the control signals generated by the sensing circuit.

BRIEF DESCRIPTION OF THE DRAWINGS (FIG.) 1 is a high-level diagram of an electronic device, according to one or more embodiments.

FIG. 6A illustrates a timing diagram of the operation of various components of a buffer when a supply voltage has a nominal value, according to one or more embodiments.

FIG. 6B illustrates a timing diagram of the operation of various components of a buffer when a supply voltage has a value higher than the nominal value, according to one or more embodiments.

FIG. 6C illustrates a timing diagram of the operation of various components of a buffer when a supply voltage has a value lower than the nominal value, according to one embodiment.

Figure 1:
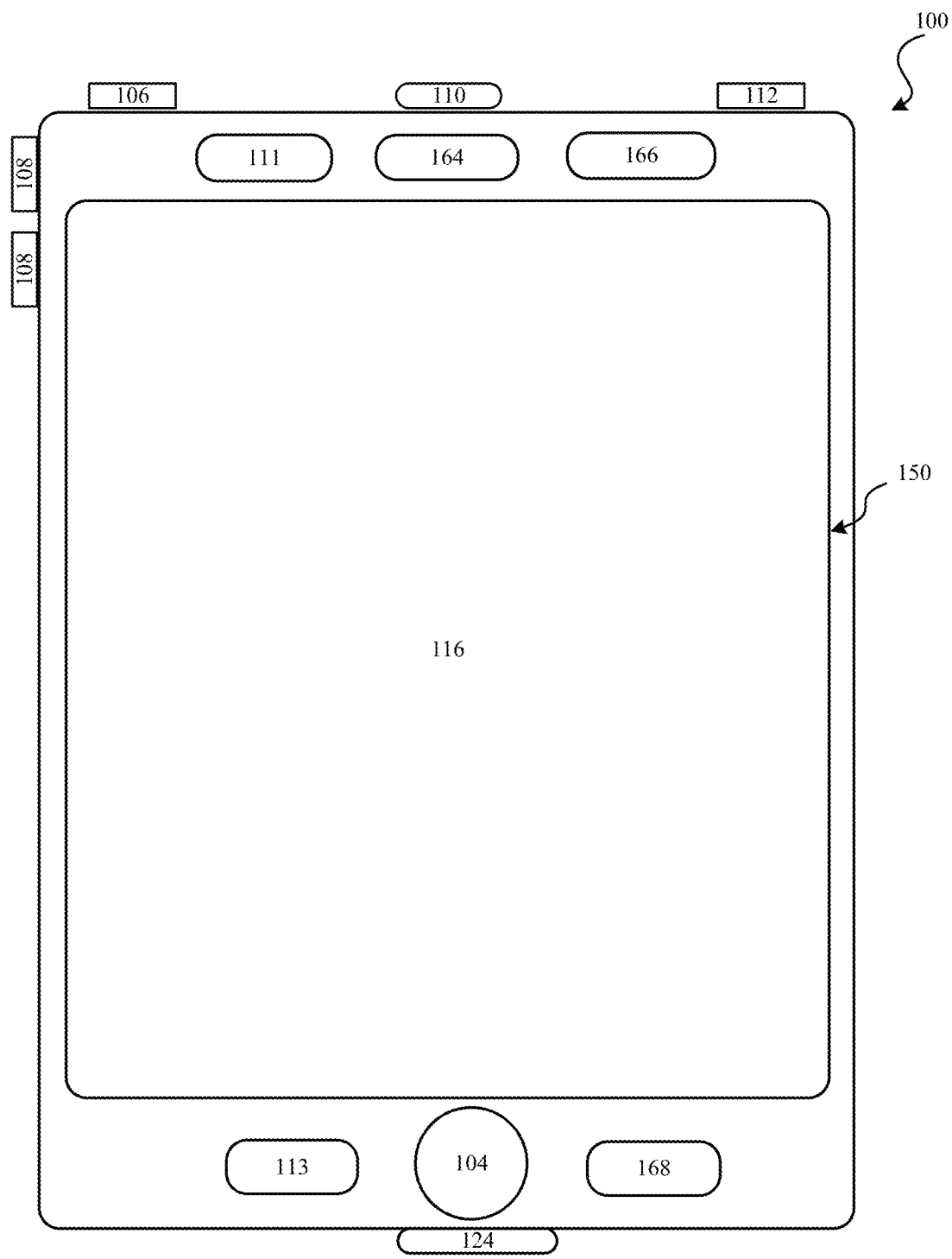

The figures depict, and the detail description describes, various non-limiting embodiments for purposes of illustration only.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, the described embodiments may be practiced without these specific details. In other instances, well-known methods, procedures, components, circuits, and networks have not been described in detail so as not to unnecessarily obscure aspects of the embodiments.

Embodiments relate to a circuit implementation for controlling a delay of a clock signal. The clock delay control circuit includes a sensing circuit and a phase interpolator controlled by the sensing circuit. The sensing circuit is configured to generate a first control signal that increases when a level of a supply voltage (e.g., Vdd) increases, and decreases when the level of the supply voltage decreases. Moreover, the sensing circuit is configured to generate a second control signal that decreases when the level of the supply voltage increases, and increases when the level of the supply voltage decreases. The phase interpolator includes an input node for receiving an input clock signal, and an output node for providing a buffered clock signal. The phase interpolator has multiple paths, each having a different propagation delay. Each path receives the clock signal and delays the clock signal by their specific propagation delay. Furthermore, a coupling between each path and the output node of the phase interpolator is controlled by the control signals generated by the sensing circuit.

In some embodiments, the phase interpolator includes a first path having a first buffer and a first transmission gate between an output of the first buffer and the output of the phase interpolator. The first buffer has a first propagation delay for delaying the clock signal received through the input node of the phase interpolator. The first transmission gate is configured to control the coupling between the output of the first buffer and the output of the phase interpolator based on the first control signal. Moreover, the phase interpolator includes a second path having a second buffer and a second transmission gate between an output of the second buffer and the output of the phase interpolator. The second buffer has a second propagation delay slower than the first propagation delay. The second transmission gate is configured to control the coupling between the output of the second buffer and the output of the phase interpolator based on the second control signal.

In some embodiments, the first transmission gate is configured to increase the coupling between the output of the first buffer and the output of the phase interpolator in response to a decrease of the level of the supply voltage, and the second transmission gate is configured to decrease a coupling between the output of the second buffer and the output of the phase interpolator in response to the decrease of the level of the supply voltage. Additionally, the first transmission gate is configured to decrease a coupling between the output of the first buffer and the output of the phase interpolator in response to an increase of the level the supply voltage, and the second transmission gate is configured to increase a coupling between the output of the second buffer and the output of the phase interpolator in response to the increase of the level the supply voltage.

Exemplary Electronic Device

Embodiments of electronic devices, user interfaces for such devices, and associated processes for using such devices are described. In some embodiments, the device is a portable communications device, such as a mobile telephone, that also contains other functions, such as personal digital assistant (PDA) and/or music player functions. Exemplary embodiments of portable multifunction devices include, without limitation, the iPhone®, iPod Touch®, Apple Watch®, and iPad® devices from Apple Inc. of Cupertino, Calif. Other portable electronic devices, such as wearables, laptops or tablet computers, are optionally used. In some embodiments, the device is not a portable communications device, but is a desktop computer or other computing device that is not designed for portable use. In some embodiments, the disclosed electronic device may include a touch sensitive surface (e.g., a touch screen display and/or a touch pad). An example electronic device described below in conjunction with FIG. 1 (e.g., device 100) may include a touch-sensitive surface for receiving user input. The electronic device may also include one or more other physical user-interface devices, such as a physical keyboard, a mouse and/or a joystick.

Figure (FIG.) 1 is a high-level diagram of an electronic device 100, according to one or more embodiments. Device 100 may include one or more physical buttons, such as a "home" or menu button 104. Menu button 104 is, for example, used to navigate to any application in a set of applications that are executed on device 100. In some embodiments, menu button 104 includes a fingerprint sensor that identifies a fingerprint on menu button 104. The fingerprint sensor may be used to determine whether a finger on menu button 104 has a fingerprint that matches a fingerprint stored for unlocking device 100. Alternatively, in some embodiments, menu button 104 is implemented as a soft key in a graphical user interface (GUI) displayed on a touch screen.

In some embodiments, device 100 includes touch screen 150, menu button 104, push button 106 for powering the device on/off and locking the device, volume adjustment buttons 108, Subscriber Identity Module (SIM) card slot 110, head set jack 112, and docking/charging external port 124. Push button 106 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 100 also accepts verbal input for activation or deactivation of some functions through microphone 113. The device 100 includes various components including, but not limited to, a memory (which may include one or more computer readable storage mediums), a memory controller, one or more central processing units (CPUs), a peripherals interface, an RF circuitry, an audio circuitry, speaker 111, microphone 113, input/output (I/O) subsystem, and other input or control devices. Device 100 may include one or more image sensors 164, one or more proximity sensors 166, and one or more accelerometers 168. The device 100 may include components not shown in FIG. 1.

Device 100 is only one example of an electronic device, and device 100 may have more or fewer components than listed above, some of which may be combined into a component or have a different configuration or arrangement. The various components of device 100 listed above are embodied in hardware, software, firmware or a combination thereof, including one or more signal processing and/or application specific integrated circuits (ASICs). Device 100 may include one or more current sense circuits described herein.

Figure 2:
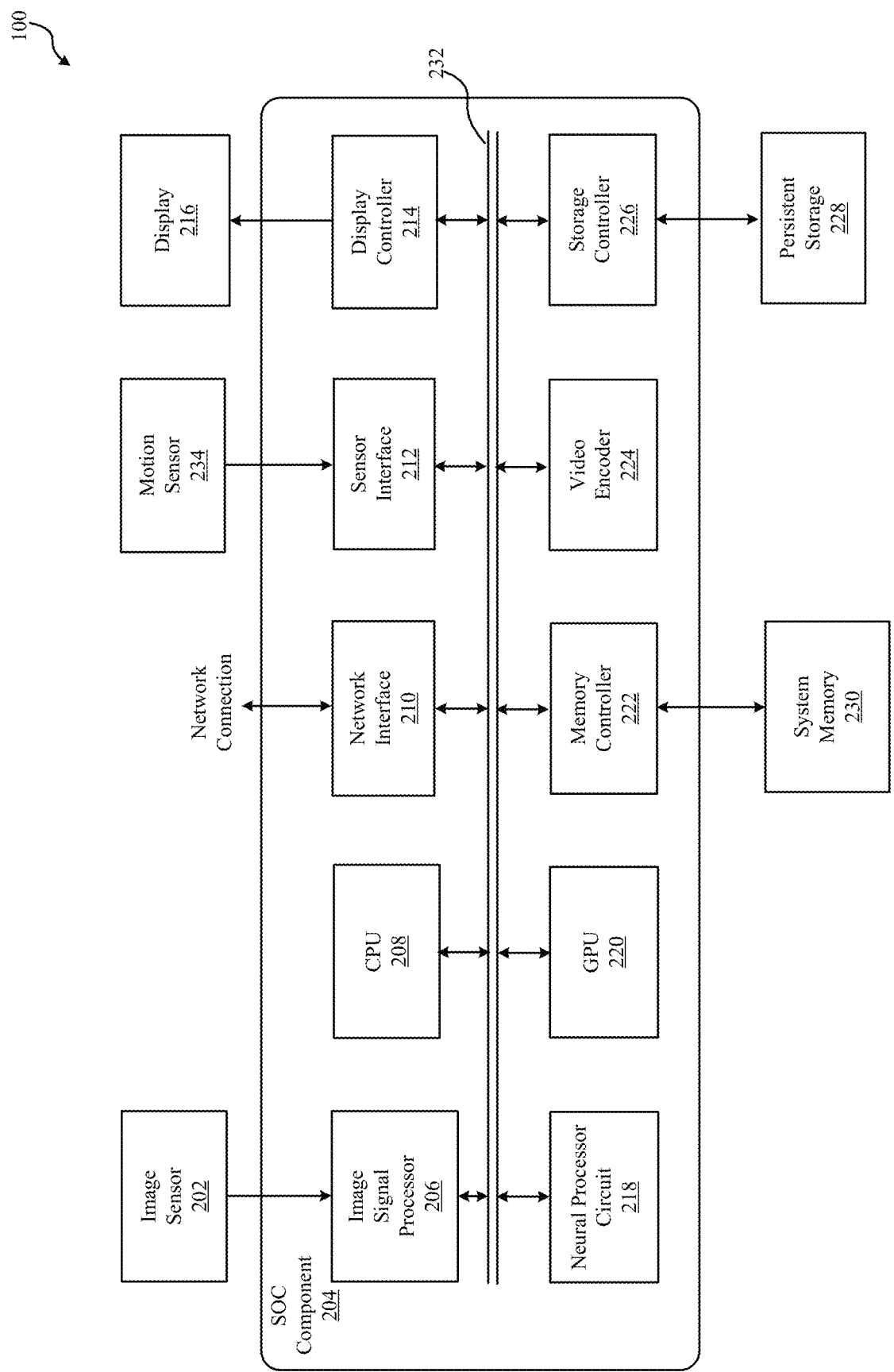
FIG. 2 is a block diagram illustrating components in the electronic device, according to one or more embodiments.

FIG. 2 is a block diagram illustrating components in device 100, according to one or more embodiments. Device 100 may perform various operations including implementing one or more machine learning models. For this and other purposes, device 100 may include, among other components, image sensors 202, a system-on-a chip (SOC) component 204, a system memory 230, a persistent storage (e.g., flash memory) 228, a motion sensor 234, and a display 216. The components as illustrated in FIG. 2 are merely illustrative. For example, device 100 may include other components (such as speaker or microphone) that are not illustrated in FIG. 2. Further, some components (such as motion sensor 234) may be omitted from device 100.

Image sensors 202 are components for capturing image data and may be embodied, for example, as a complementary metal-oxide-semiconductor (CMOS) active-pixel sensor, a camera, video camera, or other devices. Image sensors 202 generate raw image data that is sent to SOC component 204 for further processing. In some embodiments, the image data processed by SOC component 204 is displayed on display 216, stored in system memory 230, persistent storage 228 or sent to a remote computing device via network connection. The raw image data generated by image sensors 202 may be in a Bayer color kernel array (CFA) pattern.

Motion sensor 234 is a component or a set of components for sensing motion of device 100. Motion sensor 234 may generate sensor signals indicative of orientation and/or acceleration of device 100. The sensor signals are sent to SOC component 204 for various operations such as turning on device 100 or rotating images displayed on display 216.

Display 216 is a component for displaying images as generated by SOC component 204. Display 216 may include, for example, liquid crystal display (LCD) device or an organic light-emitting diode (OLED) device. Based on data received from SOC component 204, display 116 may display various images, such as menus, selected operating parameters, images captured by image sensors 202 and processed by SOC component 204, and/or other information received from a user interface of device 100 (not shown).

System memory 230 is a component for storing instructions for execution by SOC component 204 and for storing data processed by SOC component 204. System memory 230 may be embodied as any type of memory including, for example, dynamic random access memory (DRAM), synchronous DRAM (SDRAM), double data rate (DDR, DDR2, DDR3, etc.) RAMBUS DRAM (RDRAM), static RAM (SRAM) or a combination thereof.

Persistent storage 228 is a component for storing data in a non-volatile manner. Persistent storage 228 retains data even when power is not available. Persistent storage 228 may be embodied as read-only memory (ROM), flash memory or other non-volatile random access memory devices. Persistent storage 228 stores an operating system of device 100 and various software applications. Persistent storage 228 may also store one or more machine learning models, such as regression models, random forest models, support vector machines (SVMs) such as kernel SVMs, and artificial neural networks (ANNs) such as convolutional network networks (CNNs), recurrent network networks (RNNs), autoencoders, and long short term memory (LSTM). A machine learning model may be an independent model that works with the neural processor circuit 218 and various software applications or sensors of device 100. A machine learning model may also be part of a software application. The machine learning models may perform various tasks such as facial recognition, image classification, object, concept, and information classification, speech recognition, machine translation, voice recognition, voice command recognition, text recognition, text and context analysis, other natural language processing, predictions, and recommendations.

Various machine learning models stored in device 100 may be fully trained, untrained, or partially trained to allow device 100 to reinforce or continue to train the machine learning models as device 100 is used. Operations of the machine learning models include various computation used in training the models and determining results in runtime using the models. For example, in one case, device 100 captures facial images of the user and uses the images to continue to improve a machine learning model that is used to lock or unlock the device 100.

SOC component 204 is embodied as one or more integrated circuit (IC) chip and performs various data processing processes. SOC component 204 may include, among other subcomponents, image signal processor (ISP) 206, a central processor unit (CPU) 208, a network interface 210, sensor interface 212, display controller 214, neural processor circuit 218, graphics processor (GPU) 220, memory controller 222, video encoder 224, storage controller 226, and bus 232 connecting these subcomponents. SOC component 204 may include more or fewer subcomponents than those shown in FIG. 2.

ISP 206 is a circuit that performs various stages of an image processing pipeline. In some embodiments, ISP 206 may receive raw image data from image sensors 202, and process the raw image data into a form that is usable by other subcomponents of SOC component 204 or components of device 100. ISP 206 may perform various image-manipulation operations such as image translation operations, horizontal and vertical scaling, color space conversion and/or image stabilization transformations.

CPU 208 may be embodied using any suitable instruction set architecture, and may be configured to execute instructions defined in that instruction set architecture. CPU 208 may be general-purpose or embedded processors using any of a variety of instruction set architectures (ISAs), such as the x86, PowerPC, SPARC, RISC, ARM or MIPS ISAs, or any other suitable ISA. Although a single CPU is illustrated in FIG. 2, SOC component 204 may include multiple CPUs. In multiprocessor systems, each of the CPUs may commonly, but not necessarily, implement the same ISA.

Graphics processing unit (GPU) 220 is graphics processing circuitry for performing graphical data. For example, GPU 220 may render objects to be displayed into a frame buffer (e.g., one that includes pixel data for an entire frame). GPU 220 may include one or more graphics processors that may execute graphics software to perform a part or all of the graphics operation, or hardware acceleration of certain graphics operations.

Neural processor circuit 218 is a circuit that performs various machine learning operations based on computation including multiplication, addition, and accumulation. Such computation may be arranged to perform, for example, various types of tensor multiplications such as tensor product and convolution of input data and kernel data. Neural processor circuit 218 is a configurable circuit that performs these operations in a fast and power-efficient manner while relieving CPU 208 of resource-intensive operations associated with neural network operations. Neural processor circuit 218 may receive the input data from sensor interface 212, the image signal processor 206, persistent storage 228, system memory 230 or other sources such as network interface 210 or GPU 220. The output of neural processor circuit 218 may be provided to various components of device 100 such as image signal processor 206, system memory 230 or CPU 208 for various operations.

Network interface 210 is a subcomponent that enables data to be exchanged between devices 100 and other devices via one or more networks (e.g., carrier or agent devices). For example, video or other image data may be received from other devices via network interface 210 and be stored in system memory 230 for subsequent processing (e.g., via a back-end interface to image signal processor 206) and display. The networks may include, but are not limited to, Local Area Networks (LANs) (e.g., an Ethernet or corporate network) and Wide Area Networks (WANs). The image data received via network interface 210 may undergo image processing processes by ISP 206.

Sensor interface 212 is circuitry for interfacing with motion sensor 234. Sensor interface 212 receives sensor information from motion sensor 234 and processes the sensor information to determine the orientation or movement of device 100.

Display controller 214 is circuitry for sending image data to be displayed on display 216. Display controller 214 receives the image data from ISP 206, CPU 208, graphic processor or system memory 230 and processes the image data into a format suitable for display on display 216.

Memory controller 222 is circuitry for communicating with system memory 230. Memory controller 222 may read data from system memory 230 for processing by ISP 206, CPU 208, GPU 220 or other subcomponents of SOC component 204. Memory controller 222 may also write data to system memory 230 received from various subcomponents of SOC component 204.

Video encoder 224 is hardware, software, firmware or a combination thereof for encoding video data into a format suitable for storing in persistent storage 228 or for passing the data to network interface w10 for transmission over a network to another device.

In some embodiments, one or more subcomponents of SOC component 204 or some functionality of these subcomponents may be performed by software components executed on neural processor circuit 218, ISP 206, CPU 208 or GPU 220. Such software components may be stored in system memory 230, persistent storage 228 or another device communicating with device 100 via network interface 210.

Image data or video data may flow through various data paths within SOC component 204. In one example, raw image data may be generated from image sensors 202 and processed by ISP 206, and then sent to system memory 230 via bus 232 and memory controller 222. After the image data is stored in system memory 230, it may be accessed by video encoder 224 for encoding or by display 216 for displaying via bus 232.

In another example, image data is received from sources other than image sensors 202. For example, video data may be streamed, downloaded, or otherwise communicated to the SOC component 204 via wired or wireless network. The image data may be received via network interface 210 and written to system memory 230 via memory controller 222. The image data may then be obtained by ISP 206 from system memory 230 and processed through one or more image processing pipeline stages. The image data may then be returned to system memory 230 or be sent to video encoder 224, display controller 214 (for display on display 216), or storage controller 226 for storage at persistent storage 228.

Example Clock Distribution

Figure 3:
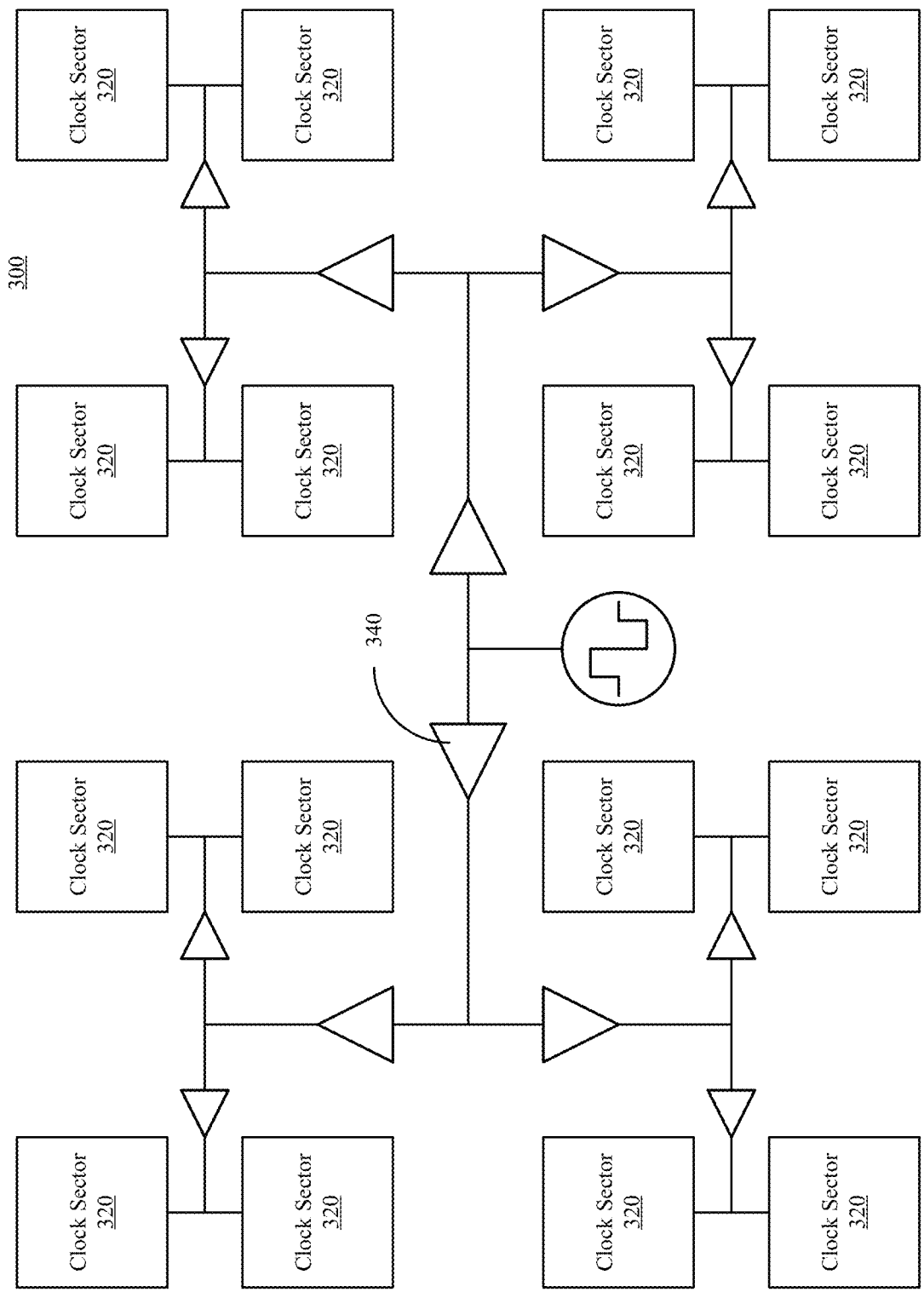
FIG. 3 illustrates a diagram of a clock distribution network, according to one or more embodiments.

FIG. 3 illustrates a diagram of a clock distribution network 300, according to one or more embodiments. The clock distribution network 300 may be used to distribute a clock signal CLK to the components of the SOC component 204. The clock distribution network 300 divides the SOC component into separate clock sectors 320. The clock delivery network includes a set of interconnects for connecting the source of the clock signal CLK to each of the clock sectors 320. In some embodiments, the interconnects are designed to balance the delay introduced by the parasitics of the interconnect (e.g., due to the resistance and the capacitance of the interconnect). In the example of FIG. 3, an H-tree topology is used to distribute the clock signal CLK.

Additionally, the clock distribution network 300 includes a set of buffers 340 to amplify the clock signal CLK. The buffers 340 receive a clock signal CLKin and generates an output signal CLKout powered from a set of supply voltages (e.g., Vdd and Gnd, or Vdd and Vss). In some embodiments, the buffers 340 allow the clock distribution network 300 to compensate for loss or degradation to the clock signal CLK due to parasitic characteristics of the interconnects used to distribute the clock signal. The buffers 340 may be embodied as one or more inverter circuits.

Example Clock Distribution Buffer Design

Figure 4A:
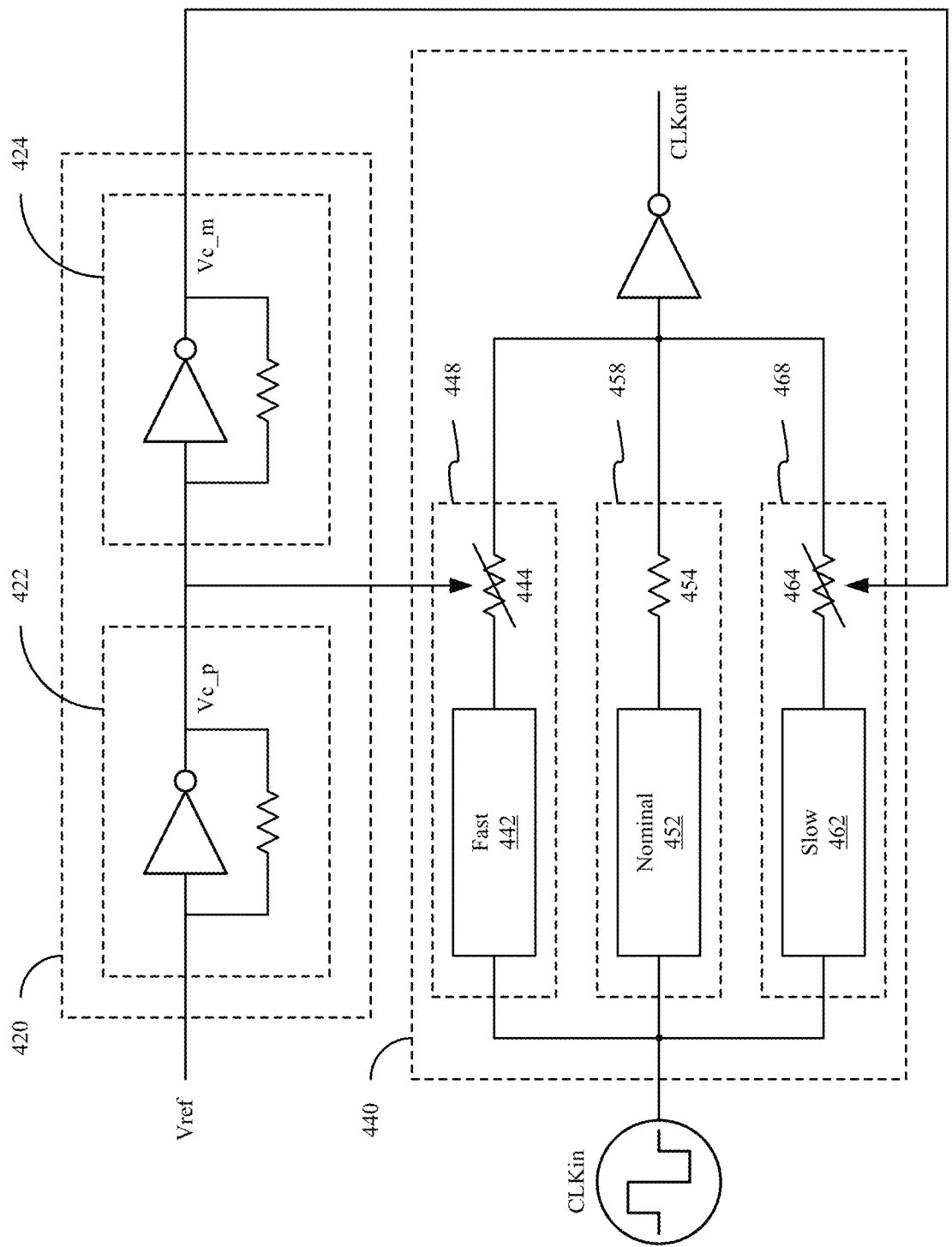
FIG. 4A illustrates a block diagram of a first implementation of a buffer, according to one or more embodiments.

FIG. 4A illustrates a block diagram of a first implementation of a buffer 340, according to one or more embodiments. The buffer 340 includes a supply voltage sensing circuit 420 and a phase interpolator 440. The supply voltage sensing circuit 420 is configured to sense the changes in the supply voltage and generate control signals based on the sensed change in the supply voltage. The phase interpolator 440 receives the control signals generated by the supply voltage sensing circuit 420 and generates an output clock signal CLKout by delaying an input clock signal CLKin based on the value of the control signals. The output clock signal CLKout may have either same polarity or the opposite polarity as input clock signal CLKin. Thus, buffer 340 may have either non-inverting or inverting behavior.

The supply voltage sensing circuit 420 includes a first inverter with resistive feedback 422 and a second inverter with resistive feedback 424. The first inverter with resistive feedback 422 is configured to receive a reference voltage Vref as an input and to generate a first control signal Vc_p as an output. The second inverter with resistive feedback 424 is configured to receive the first control signal Vc_p as an input and to generate a second control signal Vc_m as an output.

The first control signal Vc_p is configured to increase when the voltage level of the supply voltage Vdd increases, and to decrease when the voltage level of the supply voltage Vdd decreases. Moreover, the second control signal Vc_m is configured to decrease when the voltage level of the supply voltage Vdd increases, and to increase when the voltage level of the supply voltage Vdd decreases.

The phase interpolator 440 includes a first path 448 ("fast" path) having a first buffer 442 having a first propagation delay and a first transmission gate 444 (modeled as a variable resistor) controlling a coupling between the output of the first buffer 442 and the output of the phase interpolator 440. The first transmission gate 444 is configured to control a coupling between the output of the first buffer 442 and the output of the phase interpolator 440. In the example of FIG. 4A, the first transmission gate 444 is controlled by the first control signal Vc_p. As the value of the first control signal Vc_p increases, the resistance of the first transmission gate 444 is increased, decreasing the coupling between the output of the first buffer 442 and the output of the phase interpolator 440. Conversely, as the value of the first control signal Vc_p decreases, the resistance of the first transmission gate 444 is decreased, increasing the coupling between the output of the first buffer 442 and the output of the phase interpolator 440.

The phase interpolator 440 additionally includes a second path 458 ("nominal" path) having a second buffer 452 and a second transmission gate 454. The second buffer 452 has a second propagation delay, slower than the first propagation delay. In some embodiments, the second transmission gate 454 is controlled by the supply voltage Vdd. Alternatively, the second transmission gate 454 may be omitted or may be replaced by a fixed resistance.

The phase interpolator 440 further includes a third path 468 ("slow" path) having a third buffer 462 and a third transmission gate 464. The third buffer 462 has a third propagation delay, slower than the first and the second propagation delay. The third transmission gate is configured to control a coupling between the output of the third buffer 462 and the output of the phase interpolator 440. In the example of FIG. 4A, the third transmission gate 464 is controlled by the second control signal Vc_m. As the value of the second control signal Vc_m increases, the resistance of the third transmission gate 464 is increased, decreasing the coupling between the output of the third buffer 462 and the output of the phase interpolator 440. Conversely, as the value of the second control signal Vc_m decreases, the resistance of the third transmission gate 464 is decreased, increasing the coupling between the output of the third buffer 462 and the output of the phase interpolator 440.

During operation, since the first buffer 442, the second buffer 452 and the third buffer 462 are powered using the fluctuating supply voltage Vdd, as the voltage level of the supply voltage Vdd increases, the propagation delay of the first buffer 442, the second buffer 452 and the third buffer 462 decreases. Thus, to adjust the overall propagation delay of the phase interpolator 440, the coupling of the output of the third buffer 462 having the largest propagation delay is increased and the coupling of the output of the first buffer 442 having the smallest propagation delay is decreased. That is, when the supply voltage Vdd has a voltage level higher than a nominal value, the phase interpolator generates the output clock signal CLKout by interpolating the outputs of the third buffer 462 and the second buffer 452.

Moreover, as the voltage level of the supply voltage Vdd decreases, the propagation delay of the first buffer 442, the second buffer 452 and the third buffer 462 increases. Thus, to adjust the overall propagation delay of the phase interpolator 440, the coupling of the output of the first buffer 442 having the smallest propagation delay is increased and the coupling of the output of the third buffer 462 having the largest propagation delay is decreased. That is, when the supply voltage Vdd has a voltage level lower than a nominal value, the phase interpolator generates the output clock signal CLKout by interpolating the outputs of the first buffer 442 and the second buffer 452.

Figure 4B:
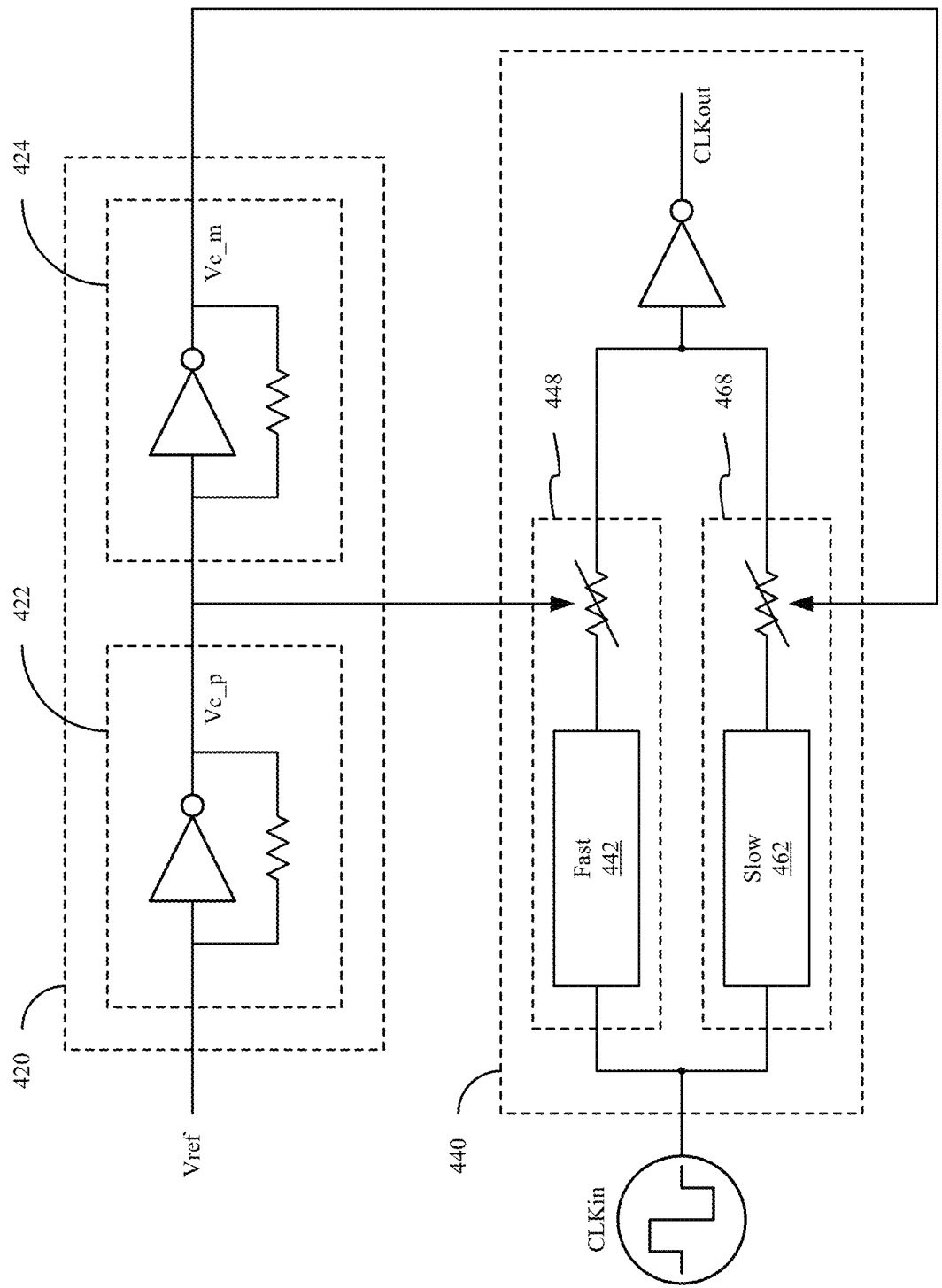
FIG. 4B illustrates a block diagram of a second implementation of a buffer, according to one or more embodiments.

FIG. 4B illustrates a block diagram of a second implementation of a buffer 340, according to one or more embodiments. The phase interpolator 440 of the buffer 340 of FIG. 4B includes the first path 448 and the third path 468. The phase interpolator 440 then generates the output clock signal CLKout by interpolating the output of the first buffer 442 and the third buffer 462. The phase interpolator controls the delay of the output clock signal CLKout with respect to the input clock signal CLKin by controlling the coupling between the output of the first buffer 442 and the output of the phase interpolator 440, and the coupling between the output of the third buffer 462 and the output of the phase interpolator 440. The buffer 340 reduces the delay of the output clock signal CLKout by reducing the resistance of the first transmission gate 444 (or by reducing the ratio between the resistance of the first transmission gate 444 and the resistance of the third transmission gate 464), and increases the delay of the output clock signal CLKout by reducing the resistance of the third transmission gate 464 (or by increasing the ratio between the resistance of the first transmission gate 444 and the resistance of the third transmission gate 464).

Figure 4C:
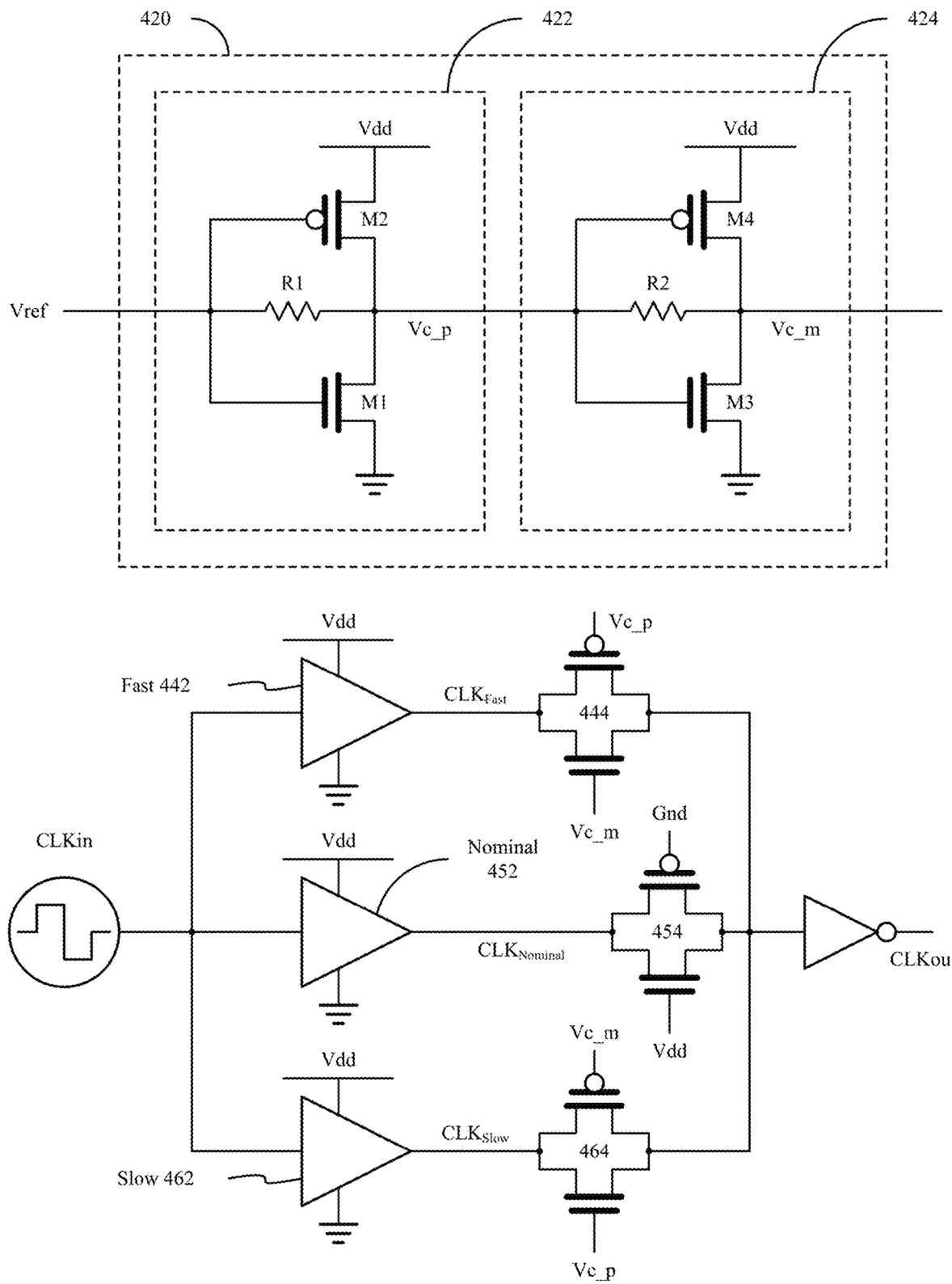
FIG. 4C illustrates a circuit diagram of a buffer, according to one or more embodiments.

FIG. 4C illustrates a circuit diagram of a buffer 340, according to one or more embodiments. The first inverter with resistive feedback 422 includes a first n-type transistor M1 coupled between ground Gnd (or a second supply voltage Vss) and the output of the first inverter with resistive feedback 422. The first n-type transistor M1 is controlled by the reference voltage Vref. The first inverter with resistive feedback 422 includes a first p-type transistor M2 coupled between the supply voltage Vdd and the output of the first inverter with resistive feedback 422. The first p-type transistor M2 is controlled by the reference voltage Vref. Moreover, the first inverter with resistive feedback 422 includes a first resistor R1 coupled between the output of the first inverter with resistive feedback 422 and the input of the first inverter with resistive feedback 422.

When the value of the supply voltage Vdd increases, the source-to-gate voltage Vsg (where Vsg=Vdd−Vref) of the first p-type transistor M2 increases, increasing the drain current of the first p-type transistor M2. The increase in the drain current of the first p-type transistor causes the voltage at the output of the first inverter with resistive feedback 422 to increase. Moreover, when the value of the supply voltage Vdd decreases, the source-to-gate voltage Vsg (where Vsg=Vdd−Vref) of the first p-type transistor M2 decreases, decreasing in the drain current of the first p-type transistor M2. The decrease in the drain current of the first p-type transistor M2 causes the voltage at the output of the first inverter with resistive feedback 422 to decrease. In some embodiments, the amount the output of the first inverter with resistive feedback 422 increased or decreased in response to a change in the value of the supply voltage Vdd is controlled by resistance of the first resistor R1. In some embodiments, the first resistor R1 is calibrated to control the amount the output of the first inverter with resistive feedback 422 increased or decreased in response to a change in the value of the supply voltage Vdd.

The second inverter with resistive feedback 424 includes a second n-type transistor M3 coupled between ground Gnd (or a second supply voltage Vss) and the output of the second inverter with resistive feedback 424. The first n-type transistor M3 is controlled by the first control signal Vc_p. The second inverter with resistive feedback 424 includes a second p-type transistor M4 coupled between the supply voltage Vdd and the output of the second inverter with resistive feedback 424. The second p-type transistor M4 is controlled by the first control signal Vc_p. Moreover, the second inverter with resistive feedback 424 includes a second resistor R2 coupled between the output of the second inverter with resistive feedback 424 and the input of the second inverter with resistive feedback 424.

When the value of the supply voltage Vdd increases, the value of the first control signal Vc_p increases. As such, as the value of the supply voltage Vdd increases, the gate-to-source voltage Vgs of the second n-type transistor M3 increases, increasing the drain current of the second n-type transistor M3. Additionally, as the value of the supply voltage Vdd increases, the source-to-gate voltage Vsg of the second p-type transistor M4 also changes. If the first inverter with resistive feedback 422 is designed such that a gain from the supply voltage Vdd to the first control signal Vc_p is greater than one, the change in voltage level of the first control signal Vc_p is greater than the change in the supply voltage Vdd. As such, as the value of the supply voltage Vdd increases, the value of the first control signal Vc_p increases at a faster rate than the value of the supply voltage Vdd. As a result, the source-to-gate voltage Vsg of the second p-type transistor M4 (where Vsg=Vdd−Vc_p) decreases, decreasing the drain current of the second p-type transistor. The increase in drain current of the second n-type transistor M3 and the decrease in drain current of the second p-type transistor M4 causes the voltage at the output of the second inverter with resistive feedback 424 to reduce.

Moreover, when the value of the supply voltage decreases, the value of the first control signal Vc_p decreases. As such, as the value of the supply voltage Vdd decreases, the gate-to-source voltage Vgs of the second n-type transistor M3 decreases, decreasing the drain current of the second n-type transistor M3. Additionally, as the value of the supply voltage Vdd decreases, the source-to-gate voltage Vsg of the second p-type transistor M4 also changes. If the first inverter with resistive feedback 422 is designed such that a gain from the supply voltage Vdd to the first control signal Vc_p is greater than one, the change in voltage level of the first control signal Vc_p is greater than the change in the supply voltage Vdd. As such, as the value of the supply voltage Vdd decreases, the value of the first control signal Vc_p decreases at a faster rate than the value of the supply voltage Vdd. As a result, the source-to-gate voltage Vsg (where Vsg=Vdd−Vc_p) increases, increasing the drain current of the second p-type transistor. The decrease in drain current of the second n-type transistor M3 and increase in drain current of the second p-type transistor M4 causes the voltage at the output of the second inverter with resistive feedback 422 to increase.

In some embodiments, the amount the output of the second inverter with resistive feedback 424 increases or decreases in response to a change in the value of the supply voltage Vdd is controlled by resistance of the second resistor R2. In some embodiments, the second resistor R2 is calibrated to control the amount the output of the second inverter with resistive feedback 424 increases or decreases in response to a change in the value of the supply voltage Vdd.

The first transmission gate 444 is implemented using a third p-type transistor controlled by the first control signal Vc_p and a third n-type transistor controlled by the second control signal Vc_m. As the value of the first control signal Vc_p increases and the value of the second control signal Vc_m decreases (i.e., as the value of the supply voltage Vdd increases), the resistance of the first transmission gate 444 increases, decreasing the coupling between the output of the first buffer 442 and the output of the phase interpolator 440. That is, the first transmission gate 444 is configured to decrease the effect of the first buffer 442 on the output of the phase interpolator 440 as the voltage level of the supply voltage Vdd increases. Conversely, as the value of the first control signal Vc_p decreases and the value of the second control signal Vc_m increases (i.e., as the value of the supply voltage Vdd decreases), the resistance of the first transmission gate 444 decreases, increasing the coupling between the output of the first buffer 442 and the output of the phase interpolator 440. That is, the first transmission gate 444 is configured to increase the effect of the first buffer 442 on the output of the phase interpolator 440 as the voltage level of the supply voltage Vdd decreases.

The second transmission gate 454 is implemented using a fourth p-type transistor controlled by Gnd and a fourth n-type transistor controlled by Vdd. In some embodiments, the second transmission gate 454 is omitted and instead the output of the second buffer 452 is directly connected to the output of the phase interpolator 440. Alternatively, the output of the second buffer 452 is coupled to the output of the phase interpolator through a resistor or other passive component.

The third transmission gate 464 is implemented using a fifth p-type transistor controlled by the second control signal Vc_m and a fifth n-type transistor controlled by the first control signal Vc_p. As the value of the first control signal Vc_p increases and the value of the second control signal Vc_m decreases (i.e., as the value of the supply voltage Vdd increases), the resistance of the third transmission gate 464 decreases, increasing the coupling between the output of the third buffer 462 and the output of the phase interpolator 440. That is, the third transmission gate 464 is configured to increase the effect of the third buffer 462 on the output of the phase interpolator 440 as the voltage level of the supply voltage Vdd increases. Conversely, as the value of the first control signal Vc_p decreases and the value of the second control signal Vc_m increases (i.e., as the value of the supply voltage Vdd decreases), the resistance of the third transmission gate 464 increases, decreasing the coupling between the output of the third buffer 462 and the output of the phase interpolator 440. That is, the third transmission gate 464 is configured to decrease the effect of the third buffer 462 on the output of the phase interpolator 440 as the voltage level of the supply voltage Vdd increases.

Example Phase Interpolator Design

Figure 5A:
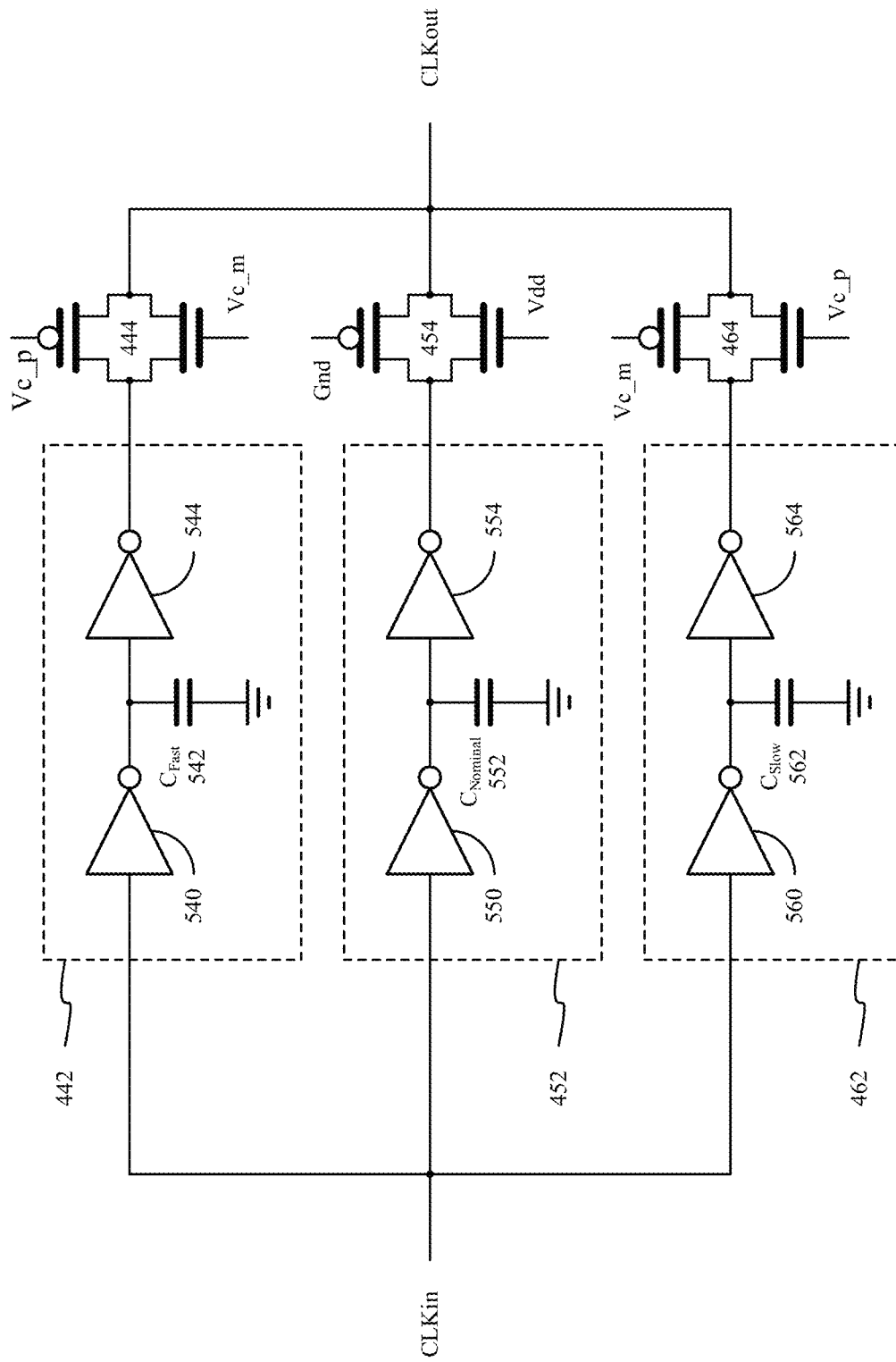
FIG. 5A illustrates a circuit diagram of a first implementation of the phase interpolator, according to one or more embodiments.

FIG. 5A illustrates a circuit diagram of a first implementation of the phase interpolator 440, according to one or more embodiments. Specifically, in the phase interpolator of FIG. 5A, the propagation delay of each buffer is controlled based on a capacitance value of a load capacitance. The first buffer 442 is implemented using an inverter 540 and a load capacitor 542 having a capacitance $C_{Fast}$. In some embodiments, the first buffer 442 additionally includes an inverter 544 receiving the output of the inverter 540 as an input and having an output connected to the first transmission gate 444. The inverter 544, in addition to inverting the output of the inverter 540, isolates the output of the inverter 540 from the output of the phase interpolator 440 and from the capacitive loads of the other branches of the phase interpolator 440.

Similarly, the second buffer 452 is implemented using an inverter 550 and a load capacitor 552 having a capacitance $C_{Nominal}$ ($C_{Nominal} > C_{Fast}$). Since the capacitance load of the inverter 550 of the second buffer 452 is larger than the capacitance load of the inverter 540 of the first buffer 442, the propagation delay of the inverter 550 of the second buffer 452 is larger than the propagation delay of the inverter 540 of the first buffer 442. In some embodiments, the second buffer 452 additionally includes an inverter 554 receiving the output of the inverter 550 as an input and having an output connected to the second transmission gate 454.

Moreover, the third buffer 462 is implemented using an inverter 560 and a load capacitor 562 having a capacitance $C_{Slow}$ ($C_{Slow} > C_{Nominal} > C_{Fast}$). Since the capacitance load of the inverter 560 of the third buffer 462 is larger than the capacitance load of the inverter 550 of the second buffer 452 and the inverter 540 of the first buffer 442, the propagation delay of the inverter 560 of third buffer 462 is larger than the propagation delay of the inverter 550 of the second buffer 452 inverter 540 of the first buffer 442. In some embodiments, the third buffer 462 additionally includes an inverter 564 receiving the output of the inverter 560 as an input and having an output connected to the third transmission gate 464.

Figure 5B:
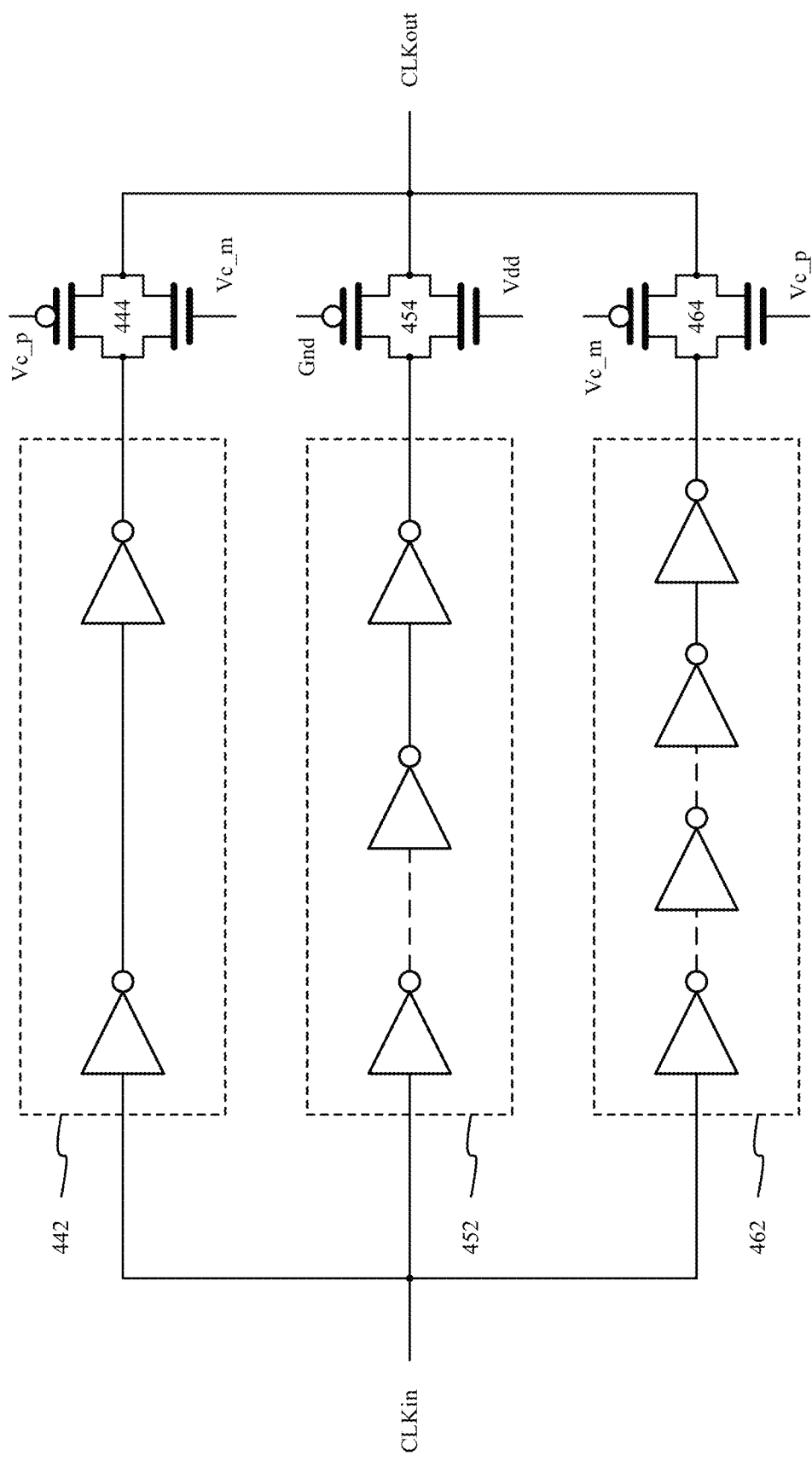
FIG. 5B illustrates a circuit diagram of a second implementation of the phase interpolator, according to one or more embodiments.

FIG. 5B illustrates a circuit diagram of a second implementation of the phase interpolator 440, according to one or more embodiments. Specifically, in the phase interpolator of FIG. 5B, the propagation delay of each buffer is controlled based on a number of inverters. The first buffer 442 is implemented using M inverters connected in series. In some embodiments, the first buffer 442 is implemented using two inverters (i.e., M=2). The second buffer 452 is implemented using N inverters connected in series (N>M). The third buffer 462 is implemented using P inverters connected in series (P >N>M). Thus, since the number of inverters connected in series in the first buffer 442 is smaller than the number of inverters connected in series in the second buffer 452, the propagation delay of the first buffer 442 is smaller than the propagation delay of the second buffer 452. Moreover, since the number of inverters connected in series in the third buffer 462 is larger than the number of inverters connected in series in the second buffer 452, the propagation delay of the third buffer 462 is larger than the propagation delay of the second buffer 452. Other values of M may be used. M, N, P may all be even numbers for non-inverting operation, or may all be odd numbers for inverting operation.

Example Clock Interpolation Operation

FIG. 6A illustrates a timing diagram of the operation of the various components of a buffer 340 when the supply voltage Vdd has a nominal value, according to one or more embodiments. FIG. 6B illustrates a timing diagram of the operation of the various components of a buffer 340 when the supply voltage Vdd has a value higher than the nominal value, according to one or more embodiments. FIG. 6C illustrates a timing diagram of the operation of the various components of a buffer 340 when the supply voltage Vdd has a value lower than the nominal value, according to one embodiment.

The buffer 340 is configured to receive an input clock signal CLKin and to generate an output clock signal CLKout having a delay $\Delta T$ with respect to the input clock signal CLKin. Moreover, when the supply voltage Vdd has a nominal value, the first buffer 442 ("fast" buffer) is configured to have a propagation delay of $\Delta T$Fat, the second buffer 452 ("nominal" buffer) is configured to have a propagation delay of $\Delta T_{Nominal}$ ($\Delta T_{Nominal} > \Delta T_{Fast}$), and the third buffer 462 ("slow" buffer) is configured to have a propagation delay of $\Delta T_{Slow}$ ($\Delta T_{Slow} > \Delta T_{Nominal} > \Delta T_{Fast}$).

However, as shown in the timing diagram of FIG. 6B, when the supply voltage Vdd increases in value, the propagation delay of each of the first buffer 442, second buffer 452, and third buffer 462 decreases. Specifically, when the supply voltage Vdd has a value Vdd'>Vdd, the first buffer 442 has a propagation delay of $\Delta T_{Fast'}$ ($\Delta T_{Fast'} < \Delta T_{Fast}$), the second buffer 452 has a propagation delay of $\Delta T_{Nominal'}$ ($\Delta T_{Nominal'} < \Delta T_{Nominal}$), and the third buffer 462 has a propagation delay of $\Delta T_{Slow'}$ ($\Delta T_{Slow'} < \Delta T_{Slow}$). Thus, in order to compensate for the faster propagation delays, the buffer 340 decreases the coupling between the first buffer 442 and the output of the phase interpolator 440 to reduce the effect of the faster output of the first buffer 442 on the output clock signal CLKout. Moreover, to compensate for the faster propagation delays, the buffer 340 increases the coupling between the third buffer 462 and the output of the phase interpolator 440 to increase the effect of the slower output of the third buffer 462 on the output clock signal CLKout. In some embodiments, to generate the output clock signal CLKout, the buffer 340 interpolates a clock signal CLK$_{Nominal}$ generated by the second buffer 452 and the clock signal CLKFat generated by the first buffer 442.

Conversely, as shown in the timing diagram of FIG. 6C, when the supply voltage Vdd decreases in value, the propagation delay of each of the first buffer 442, second buffer 452, and third buffer 462 increases. Specifically, when the supply voltage Vdd has a value Vdd"<Vdd, the first buffer 442 has a propagation delay of $\Delta T_{Fast}"$ ($\Delta T_{Fast}" > \Delta T_{Fast}$), the second buffer 452 has a propagation delay of $\Delta T_{Nominal}"$ ($\Delta T_{Nominal}" > \Delta T$Nomina), and the third buffer 462 has a propagation delay of $\Delta T_{Slow}"$ ($\Delta T_{Slow}" > \Delta T_{Slow}$). Thus, in order to compensate for the slower propagation delays, the buffer 340 increases the coupling between the first buffer 442 and the output of the phase interpolator 440 to increase the effect of the faster output of the first buffer 442 on the output clock signal CLKout. Moreover, to compensate for the slower propagation delays, the buffer 340 decreases the coupling between the third buffer 462 and the output of the phase interpolator 440 to decrease the effect of the slower output of the third buffer 462 on the output clock signal CLKout. In some embodiments, to generate the output clock signal CLKout, the buffer 340 interpolates a clock signal CLK$_{Nominal}$ generated by the second buffer 452 and the clock signal CLK$_{Slow}$ generated by the third buffer 462.

Figure 7A:
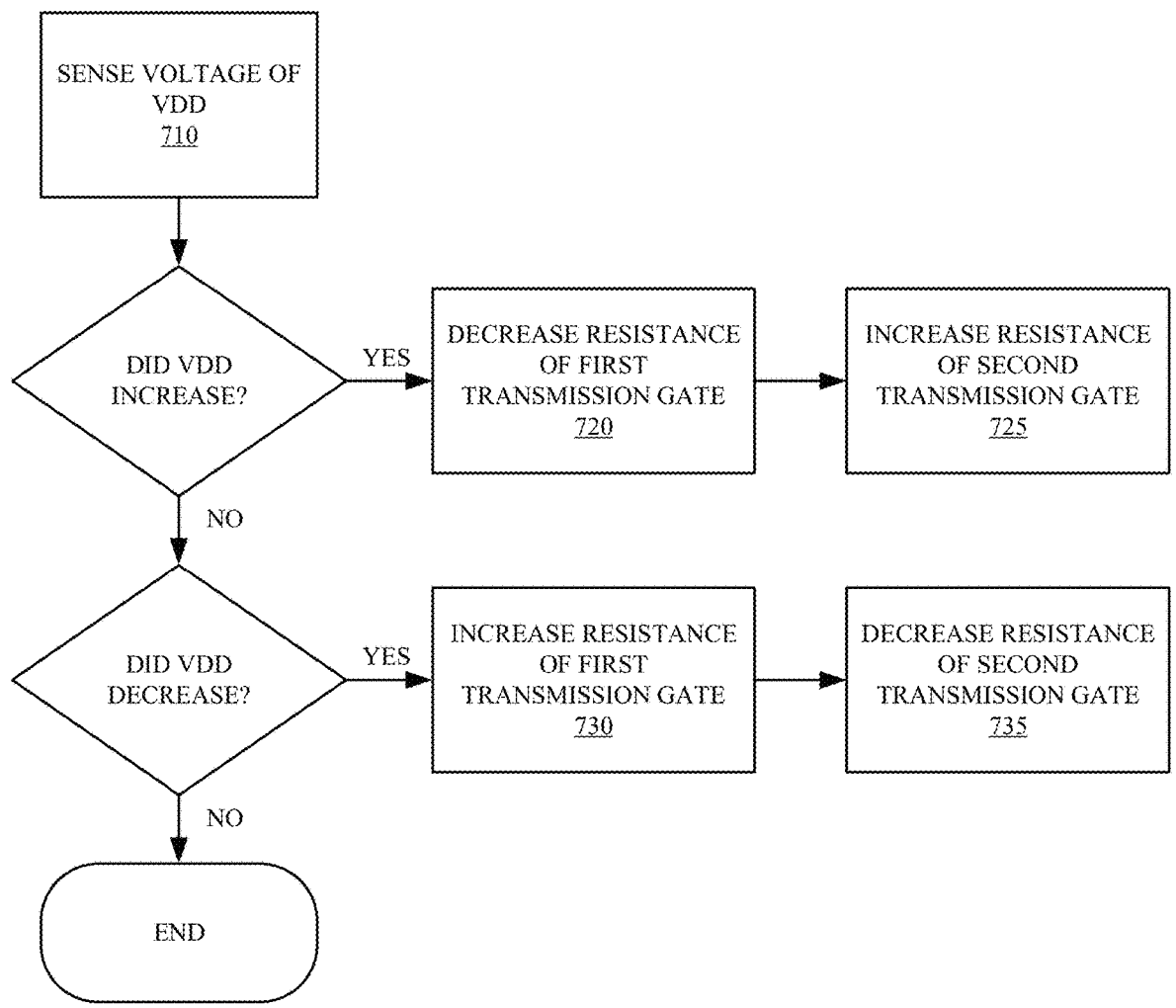
FIG. 7A illustrates a flow diagram of a process for adjusting a delay of a clock signal to compensate for a change in propagation delay due to a change in the value of a supply voltage, according to one or more embodiments.

FIG. 7A illustrates a flow diagram of a process for adjusting a delay of a clock signal to compensate for a change in propagation delay due to a change in the value of a supply voltage, according to one or more embodiments. The supply voltage sensing circuit 420 senses 710 the voltage of the supply voltage Vdd. Based on the sensing of the supply voltage Vdd, the resistance of the first transmission gate 444 and the third transmission gate 464 are adjusted.

In some embodiments, if the voltage value of the supply voltage Vdd increases, the resistance of the first transmission gate 444 is decreased 720 and the resistance of the third transmission gate 464 is increased 725. As such, the effect of the first buffer 442 on the output of the phase interpolator 440 is increased and the effect of the third buffer 462 on the output of the phase interpolator 440 is decreased.

Moreover, in some embodiments, if the voltage value of the supply voltage Vdd decreases, the resistance of the first transmission gate 444 is increased 730 and the resistance of the third transmission gate 464 is decreased 735. As such, the effect of the first buffer 442 on the output of the phase interpolator 440 is decreased and the effect of the third buffer 462 on the output of the phase interpolator 440 is increased.

In some embodiments, the process of FIG. 7A includes fewer or additional steps. For example, additional transmission gates may also be controlled based on the chain in the voltage value of the supply voltage. Moreover, in some embodiments, to control the resistance of the transmission gates, a set of control signals are generated based on the sensed voltage value of the supply voltage. For example, a first control signal that increases when the level of a supply voltage increases and decreases when the level of the supply voltage decreases, as well as a second control signal that decreases when the level of the supply voltage increases and increases when the level of the supply voltage decreases are generated.

Figure 7B:
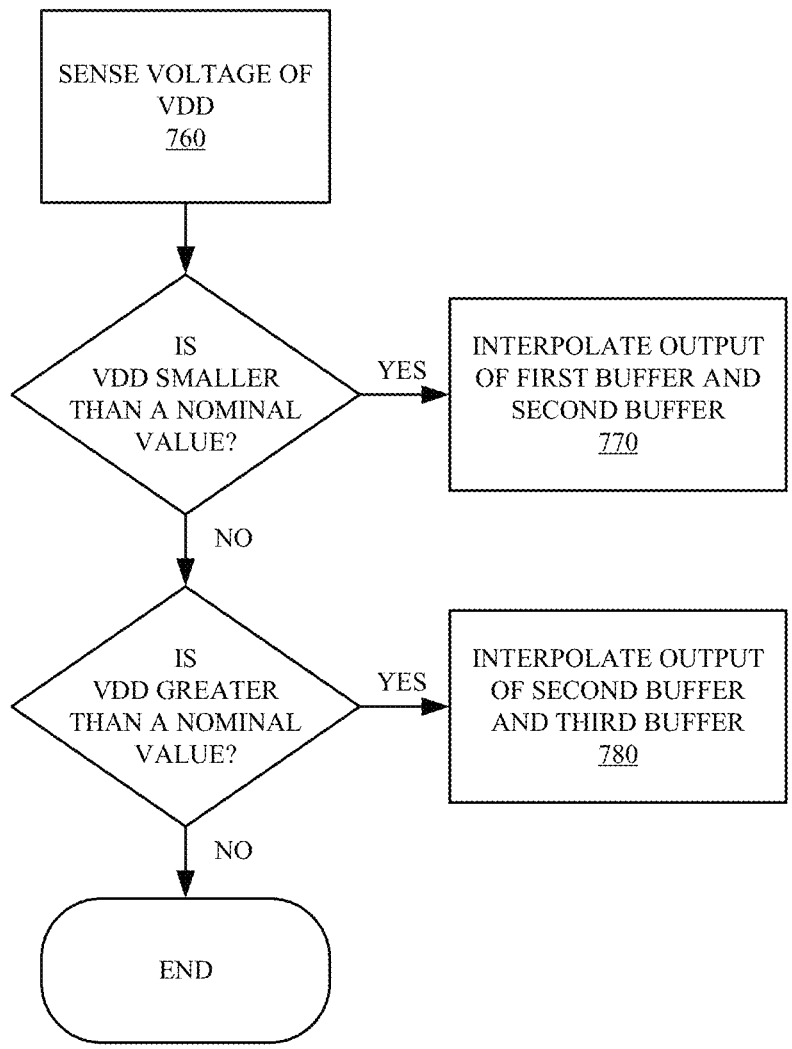
FIG. 7B illustrates a flow diagram of another process for adjusting a delay of a clock signal to compensate for a change in propagation delay due to a change in the value of a supply voltage, according to one or more embodiments.

FIG. 7B illustrates a flow diagram of another process for adjusting a delay of a clock signal to compensate for a change in propagation delay due to a change in the value of a supply voltage, according to one or more embodiments. The supply voltage sensing circuit 420 senses 760 the voltage of the supply voltage Vdd. If the voltage value of the supply voltage Vdd is smaller than its nominal value, the phase interpolator 440 generates the output clock signal CLKout by interpolating 770 the output of the first buffer 442 and the output of the second buffer 452. Alternatively, if the voltage value of the supply voltage Vdd is larger than its nominal value, the phase interpolator 440 generates the output clock signal CLKout by interpolating 780 the output of the second buffer 452 and the output of the third buffer 462.

In some embodiments, the process of FIG. 7A includes fewer or additional steps. For example, the output clock signal CLKout may be generated by interpolating the output of the first buffer 442 and the output of the third buffer 462 based on the sensed value of the supply voltage. Moreover, in some embodiments, to generate a signal by interpolating the output of two or more buffers, the coupling of the output nodes of each of the two or more buffers are adjusted. That is, the driving power of each of the two or more buffers on the output of the phase interpolator is adjusted. In some embodiments, in order to adjust the driving power or the coupling of each of the buffers, one or more control signals are generated based on the sensed value of the supply voltage.

While particular embodiments and applications have been illustrated and described, it is to be understood that the invention is not limited to the precise construction and components disclosed herein and that various modifications, changes and variations which will be apparent to those skilled in the art may be made in the arrangement, operation and details of the method and apparatus disclosed herein without departing from the spirit and scope of the present disclosure.

What is claimed is:

1. A clock delay control circuit comprising:
   a sensing circuit configured to generate a first control signal that increases when a level of a supply voltage increases and decreases when the level of the supply voltage decreases, and generate a second control signal that decreases when the level of the supply voltage increases and increases when the level of the supply voltage decreases; and
   a phase interpolator circuit having an input node for receiving an input clock signal, and an output node for providing a buffered clock signal, the phase interpolator circuit comprising:
      a first buffer having an input node coupled to the input node of the phase interpolator circuit, the first buffer having a first delay,
      a first transmission gate between an output node of the first buffer and the output node of the phase interpolator circuit, the first transmission gate configured to control a coupling between the output node of the first buffer and the output node of the phase interpolator circuit based on the first control signal,
      a second buffer having an input node coupled to the input node of the phase interpolator circuit, the second buffer having a second delay slower than the first delay, and
      a second transmission gate between an output node of the second buffer and the output node of the phase interpolator circuit, the second transmission gate configured to control a coupling between the output node of the second buffer and the output node of the phase interpolator circuit based on the second control signal.

2. The clock delay control circuit of claim 1, wherein the sensing circuit comprises:
   a first inverter with resistive feedback receiving a reference voltage as an input and providing the first control signal as an output, and
   a second inverter with resistive feedback receiving the output of the first inverter and providing the second control signal as an output.

3. The clock delay control circuit of claim 1, wherein the first transmission gate is configured to increase a coupling between the output node of the first buffer and the output node of the phase interpolator circuit in response to a decrease of the level of the supply voltage, and wherein the second transmission gate is configured to decrease a coupling between the output node of the second buffer and the output node of the phase interpolator circuit in response to the decrease of the level of the supply voltage.

4. The clock delay control circuit of claim 3, wherein a resistance of the first transmission gate is reduced in response to the decrease of the level of the supply voltage, and wherein a resistance of the second transmission gate is increased in response to the decrease of the level of the supply voltage.

5. The clock delay control circuit of claim 1, wherein the first transmission gate is configured to decrease a coupling between the output node of the first buffer and the output node of the phase interpolator circuit in response to an increase of the level the supply voltage, and wherein the second transmission gate is configured to increase a coupling between the output node of the second buffer and the output node of the phase interpolator circuit in response to the increase of the level the supply voltage.

6. The clock delay control circuit of claim 5, wherein a resistance of the first transmission gate is increased in response to the increase of the level of the supply voltage, and wherein a resistance of the second transmission gate is reduced in response to the decrease of the level of the supply voltage.

7. The clock delay control circuit of claim 1, wherein the phase interpolator circuit further comprises:
   a third buffer having an input node coupled to the input node of the phase interpolator circuit, the third buffer having a third delay, faster than the second delay and slower than the first delay; and
   a third transmission gate coupled between an output node of the third buffer and the output node of the phase interpolator circuit.

8. The clock delay control circuit of claim 1, wherein the first buffer comprises a first inverter and a first capacitor coupled to an output node of the first inverter, the first capacitor having a first capacitance value, and wherein the second buffer comprises a second inverter and a second capacitor coupled to an output node of the second inverter, the second capacitor having a second capacitance value larger than the first capacitance value.

9. The clock delay control circuit of claim 1, wherein the first buffer comprises a first set of inverters connected in series, wherein the second buffer comprises a second set of inverters connected in series, and wherein a number of inverters in the second set of inverters is greater than a number of inverters in the second set of inverters.

10. A method for controlling a delay of a clock signal, comprising:
    generating a first control signal, the first control signal configured to increase when a level of a supply voltage increases and decrease when the level of the supply voltage decreases,
    generating a second control signal, the second control signal configured to decrease when the level of the supply voltage increases and increase when the level of the supply voltage decreases,
    controlling a coupling between an output node of a first buffer and an output node of a phase interpolator circuit based on the first control signal, the first buffer having a first delay, and
    controlling a coupling between an output node of a second buffer and the output node of the phase interpolator circuit based on the second control signal, the second buffer having a second delay slower than the first delay.

11. The method of claim 10, wherein controlling the coupling between the output node of the first buffer and the output node of the phase interpolator circuit comprises controlling a first transmission gate based on the first control signal, the first transmission gate between the output node of the first buffer and the output node of the phase interpolator circuit.

12. The method of claim 11, wherein controlling the coupling between the output node of the second buffer and the output node of the phase interpolator circuit comprises controlling a second transmission gate based on the second control signal, the second transmission gate between the output node of the second buffer and the output node of the phase interpolator circuit.

13. The method of claim 12, wherein the first transmission gate is configured to increase a coupling between the output node of the first buffer and the output node of the phase interpolator circuit in response to a decrease of the level of the supply voltage, and wherein the second transmission gate is configured to decrease a coupling between the output node of the second buffer and the output node of the phase interpolator circuit in response to the decrease of the level of the supply voltage.

14. The method of claim 13, wherein a resistance of the first transmission gate is reduced in response to the decrease of the level of the supply voltage, and wherein a resistance of the second transmission gate is increased in response to the decrease of the level of the supply voltage.

15. The method of claim 12, wherein the first transmission gate is configured to decrease a coupling between the output node of the first buffer and the output node of the phase interpolator circuit in response to an increase of the level the supply voltage, and wherein the second transmission gate is configured to increase a coupling between the output node of the second buffer and the output node of the phase interpolator circuit in response to the increase of the level the supply voltage.

16. The method of claim 15, wherein a resistance of the first transmission gate is increased in response to the increase of the level of the supply voltage, and wherein a resistance of the second transmission gate is reduced in response to the decrease of the level of the supply voltage.

17. The method of claim 10, wherein the first delay of the first buffer is set based on a capacitance of a first capacitor coupled to the output node of the first buffer, and wherein the second delay of the second buffer is set based on a capacitance of a second capacitor coupled to the output node of the second buffer.

18. The method of claim 10, wherein the first buffer comprises a first set of inverters connected in series, wherein the second buffer comprises a second set of inverters connected in series, and wherein a number of inverters in the second set of inverters is greater than a number of inverters in the second set of inverters.

19. A phase interpolator circuit having an input node for receiving an input clock signal, and an output node for providing a buffered clock signal, the phase interpolator circuit comprising:

a first buffer having an input node coupled to the input node of the phase interpolator circuit, the first buffer having a first delay;

a first transmission gate between an output node of the first buffer and the output node of the phase interpolator circuit, the first transmission gate configured to control a coupling between the output node of the first buffer and the output node of the phase interpolator circuit based on a first control signal, the first control signal configured to increase when a level of a supply voltage increases and decrease when the level of the supply voltage decreases;

a second buffer having an input node coupled to the input node of the phase interpolator circuit, the second buffer having a second delay slower than the first delay, and a second transmission gate between an output node of the second buffer and the output node of the phase interpolator circuit, the second transmission gate configured to control a coupling between the output node of the second buffer and the output node of the phase interpolator circuit based on the second control signal, the second control signal configured to decrease when the level of the supply voltage increases and increase when the level of the supply voltage decreases.

20. The phase interpolator circuit of claim 1, wherein:

the first transmission gate is configured to increase a coupling between the output node of the first buffer and the output node of the phase interpolator circuit in response to a decrease of the level of the supply voltage, and wherein the second transmission gate is configured to decrease a coupling between the output node of the second buffer and the output node of the phase interpolator circuit in response to the decrease of the level of the supply voltage; and the first transmission gate is configured to decrease a coupling between the output node of the first buffer and the output node of the phase interpolator circuit in response to an increase of the level the supply voltage, and wherein the second transmission gate is configured to increase a coupling between the output node of the second buffer and the output node of the phase interpolator circuit in response to the increase of the level the supply voltage.

* * * * *

UNITED STATES PATENT AND TRADEMARK OFFICE
CERTIFICATE OF CORRECTION

PATENT NO. : 11,392,163 B1
APPLICATION NO. : 17/482877
DATED : July 19, 2022
INVENTOR(S) : Sun et al.

Page 1 of 1

It is certified that error appears in the above-identified patent and that said Letters Patent is hereby corrected as shown below:

In the Claims

In Column 16, Line 1, Claim 5, delete "level the" and insert -- level of the --, In Column 16, Line 5, Claim 5, delete "level the" and insert -- level of the --, In Column 17, Line 18, Claim 15, delete "level the" and insert -- level of the --, In Column 17, Line 22, Claim 15, delete "level the" and insert -- level of the --, In Column 18, Line 38, Claim 20, delete "level the" and insert -- level of the --, and In Column 18, Line 42, Claim 20, delete "level" and insert -- level of --.

Signed and Sealed this
Eleventh Day of October, 2022

Katherine Kelly Vidal
*Director of the United States Patent and Trademark Office*